US007816916B2

(12) United States Patent
Fasano et al.

(10) Patent No.: US 7,816,916 B2
(45) Date of Patent: Oct. 19, 2010

(54) MAGNETIC RESONANCE IMAGING METHOD USING A PARALLEL IMAGING TECHNIQUE COMBINED WITH A ZOOMED ACQUISITION TECHNIQUE

(75) Inventors: Fabrizio Fasano, Rome (IT); Robin Heidemann, Strullendorf (DE); Josef Pfeuffer, Newton, MA (US)

(73) Assignees: Siemens Aktiengesellschaft, Munich (DE); Siemens S.p.A., Milan (IT)

( * ) Notice: Subject to any disclaimer, the term of this patent is extended or adjusted under 35 U.S.C. 154(b) by 43 days.

(21) Appl. No.: 12/210,614

(22) Filed: Sep. 15, 2008

(65) Prior Publication Data

US 2010/0066360 A1    Mar. 18, 2010

(51) Int. Cl.
*G01V 3/00* (2006.01)
(52) U.S. Cl. .................................................. 324/307
(58) Field of Classification Search ......... 324/300–322; 600/410–435
See application file for complete search history.

(56) References Cited

U.S. PATENT DOCUMENTS

| | | | | |
|---|---|---|---|---|
| 4,748,409 A | * | 5/1988 | Frahm et al. ................. | 324/309 |
| 5,036,281 A | * | 7/1991 | Li ............................... | 324/309 |
| 5,063,348 A | * | 11/1991 | Kuhara et al. ................ | 324/307 |
| 5,162,736 A | * | 11/1992 | Mansfield et al. ........... | 324/309 |
| 5,168,228 A | * | 12/1992 | Mansfield et al. ........... | 324/309 |
| 5,594,849 A | * | 1/1997 | Kuc et al. ..................... | 345/632 |
| 6,196,715 B1 | * | 3/2001 | Nambu et al. ................ | 378/197 |
| 6,586,934 B2 | * | 7/2003 | Biglieri et al. ............... | 324/309 |
| 6,593,741 B2 | * | 7/2003 | Bydder et al. ................ | 324/307 |
| 6,630,828 B1 | * | 10/2003 | Mistretta et al. ............. | 324/309 |
| 6,946,839 B2 | * | 9/2005 | Porter .......................... | 324/309 |
| 2009/0285463 A1 | * | 11/2009 | Otazo et al. .................. | 382/131 |

FOREIGN PATENT DOCUMENTS

GB        2 205 410 A    12/1988

OTHER PUBLICATIONS

"ADC Mapping of the Human Optic Nerve: Increased Resolution, Coverage, and Reliability With CSF-Suppressed ZOOM-EPI," Wheeler-Kingshott et al, Magnetic Resonance In Medicine, vol. 47 (2002) pp. 24-31.
"Zonally Magnified EPI In Real Time by NMR," Mansfield et al, J. Phys. E. Si. Instrum., vol. 21, (1998) pp. 275-280.
"Zoomed Functional Imaging in the Human Brain at 7 Tesla With Simultaneous High Spatial and High Temporal Resolution," Pfeuffer et al, NeuroImage vol. 17 (2002) pp. 272-286.
"In Vivo Diffusion Tensor Imaging of the Human Optic Nerve: Pilot Study in Normal Controls," Wheeler-Kingshott et al, Magnetic Resonance in Medicine, vol. 18 (2008) pp. 446-451.

* cited by examiner

*Primary Examiner*—Brij B Shrivastav
*Assistant Examiner*—Dixomara Vargas
(74) *Attorney, Agent, or Firm*—Schiff Hardin LLP

(57) ABSTRACT

In a magnetic resonance imaging method and apparatus, magnetic resonance data are acquired (an examination subject) using a zoomed method, and reconstruction of the image of the examination subject is undertaken using a parallel imaging reconstruction method.

10 Claims, 5 Drawing Sheets

FIG. 2
(PRIOR ART)
Zoomed Technique
Full FOV
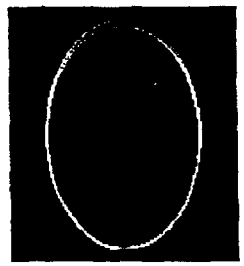
Unaccelerated
Full FOV
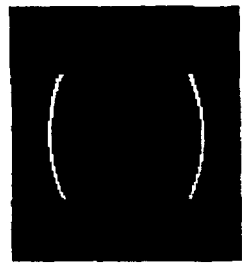
Unaccelerated, with zoomed technique
Reduced FOV
Accelerated by a factor of 2, with zoomed technique, (no visible convolutions)

Phantom Study:
(a) Conventional EPI,
(b) Image sub-sampled 4 times (severe convolutions)
(c) GRAPPA EPI reconstruction accelerated 4-fold (remaining artifacts),
(d) Zoomed EPI accelerated 4-fold (convolutions visible),
(e) Zoomed GRAPPA EPI accelerated 4-fold (artifacts are significantly reduced),
(d) Difference image between (d) and (e)

In vivo Study:
(top) Conventional EPI, unaccelerated
(middle) zoomed EPI, accelerated 4-fold
(bottom) zoomed GRAPPA EPI, accelerated 4-fold

MAGNETIC RESONANCE IMAGING METHOD USING A PARALLEL IMAGING TECHNIQUE COMBINED WITH A ZOOMED ACQUISITION TECHNIQUE

BACKGROUND OF THE INVENTION

1. Field of the Invention

The present invention relates to a method and an apparatus for magnetic resonance imaging.

2. Description of the Prior Art

Various magnetic resonance imaging techniques are known within the category designated "parallel imaging." These techniques have in common the use of multiple data acquisition (RF) coils, that each acquire, either simultaneously or substantially simultaneously, a set of magnetic resonance data. Each coil acquires a reduced set of k-space data, with no single set of k-space data, acquired by one coil being sufficient for generating a complete image of the examination subject. The data acquisition is thus accelerated, and the time required for obtaining all of the data necessary to generate an image of the subject is reduced. The respective data sets acquired by the multiple coils are combined in an appropriate manner using information about the individual coils, such as their location or sensitivity.

Despite the advantage achieved by shortening the time for acquiring the necessary data for generating an image of the subject, parallel imaging has the disadvantage associated therewith that convolution artifacts can arise in the image. The reason for this is schematically illustrated in FIG. 1. The sub-sampling in k-space leads to a reduced field of view (FOV) in image space (image domain). If the examination subject is larger than the reduced FOV, this leads to a convolution of the regions of the subject that lie outside of the reduced FOV, resulting in convolution artifacts in the image.

In parallel imaging, either the missing k-space data are reconstructed (as in the sequence known as GRAPPA) or the convoluted images are deconvoluted (as in the sequence known as SENSE). The primary problem in parallel imaging is image disruptions that arise due to inherent errors in the reconstruction. These artifacts occur primarily with the use of high acceleration factors, typically acceleration factors greater than two. Remaining convolution artifacts occur in k-space-based methods (such as GRAPPA) has shown in image (c) in FIG. 4), and noise amplification in the image occurs in image space-based methods (such as SENSE).

In addition to parallel imaging, imaging methods known as zoomed methods known are known that also allow an accelerated data acquisition. The basic features of the known zoomed technique is shown in FIG. 2. A reduced FOV is acquired in the zoomed method, similar to that in parallel imaging. In order to avoid convolution artifacts in the reduced FOV, either the signals from the outer regions are suppressed with saturation pulses emitted in advance (known as the "outer volume suppression" or "OVS" method), or only the region inside the reduced FOV is excited ("inner volume excitation" method). In both of these methods, convolution artifacts still can occur, due to an imperfect saturation of the outer regions in the OVS method, as shown in image (d) of FIG. 4 and the middle image in FIG. 5, or by an imprecisely (fuzzy) demarcated excitation of the region within the reduced FOV in the inner volume excitation method.

These drawbacks associated with these known types of imaging sequences have previously been addressed in the case of parallel imaging by a recommendation from apparatus manufacturers either not to use parallel imaging for certain applications, or to use parallel imaging with only a relatively small acceleration factor, such as an acceleration factor that is not greater than two. Problematic uses of parallel imaging include fMRI and spine imaging.

Resort to the zoomed method cannot be undertaken by default, because a patent exists with regard to the inner volume excitation method (GB 2 205 410 A).

The zoomed method was first described in 1988 in the context of echo planar imaging (EPI), in the article by Mansfield et al entitled "Zonally Magnified EPI in Real Time by NMR", *J. Phys. E. Sci. Instrum*, Vol. 21, (1988), pages 275-280). Zoomed EPI for ultra-high field fMRI at 7 Tesla is described in the article by Pfeuffer et al., "Zoomed Functional Imaging in the Human Brain at 7 Tesla with Simultaneous High Spatial and High Temporal Resolution" NeuroImage, Vol. 17 (2002) pages 272-286. Zoomed EPI for DTI on the optic nerve is described in the article by Kingshott et al, "In Vivo Diffusion Tensor Imaging of the Human Optic Nerve: Pilot Study in Normal Control," Magnetic Resonance in Medicine, Vol. 56 (2006), pages 446-451.

The problems described above in connection with zoomed methods still exist.

SUMMARY OF THE INVENTION

The problems associated with known parallel imaging techniques and zoomed methods are solved in accordance with the present invention by a magnetic resonance imaging method and apparatus wherein a zoomed technique is combined with parallel imaging. The inventive method and apparatus are based on the insight that, in parallel imaging, artifacts caused by inherent errors in the reconstruction can be reduced or suppressed with a zoomed method in advance, and by the use of parallel imaging, convolution artifacts due to imperfect saturators, or imprecisely demarcated excitation, can be removed after the data acquisition.

The particular method of parallel imaging and the particular zoomed methods that are employed are not important. Any known parallel imaging method and any known zoomed method can be used in combination.

BRIEF DESCRIPTION OF THE DRAWINGS

FIG. 2, as noted above, schematically illustrates the basic features of known zoomed methods.

DESCRIPTION OF THE PREFERRED EMBODIMENTS

In accordance with the present invention, magnetic resonance data are acquired from an examination subject with a combination of a zoomed technique and parallel imaging. The known zoomed technique that is used and the known parallel imaging technique that is used are not important. The zoomed technique may be, for example, the OVS method, and the parallel imaging method may be, for example, GRAPPA.

In parallel imaging, artifacts that are caused by inherent errors in the reconstruction can be reduced or suppressed with the zoomed method being used in advance of the parallel imaging data acquisition. With the use of parallel imaging, convolution artifacts due to imperfect saturation (OVS) or imprecisely demarcated excitation (inner volume excitation) can be removed after the data acquisition.

Small local coils with narrowly limited sensitivity can be used in order to improve the zoomed effect, and may possibly even make the employment of parallel imaging superfluous. Local excitation by means of multi-channel transmission methods can also be used in order to achieve a local limited excitation.

The zoomed preparation can be implemented before the actual data acquisition with parallel imaging, or the parallel reconstruction can be conducted as a first-processing method after data acquisition with the zoomed method.

Figure 1:
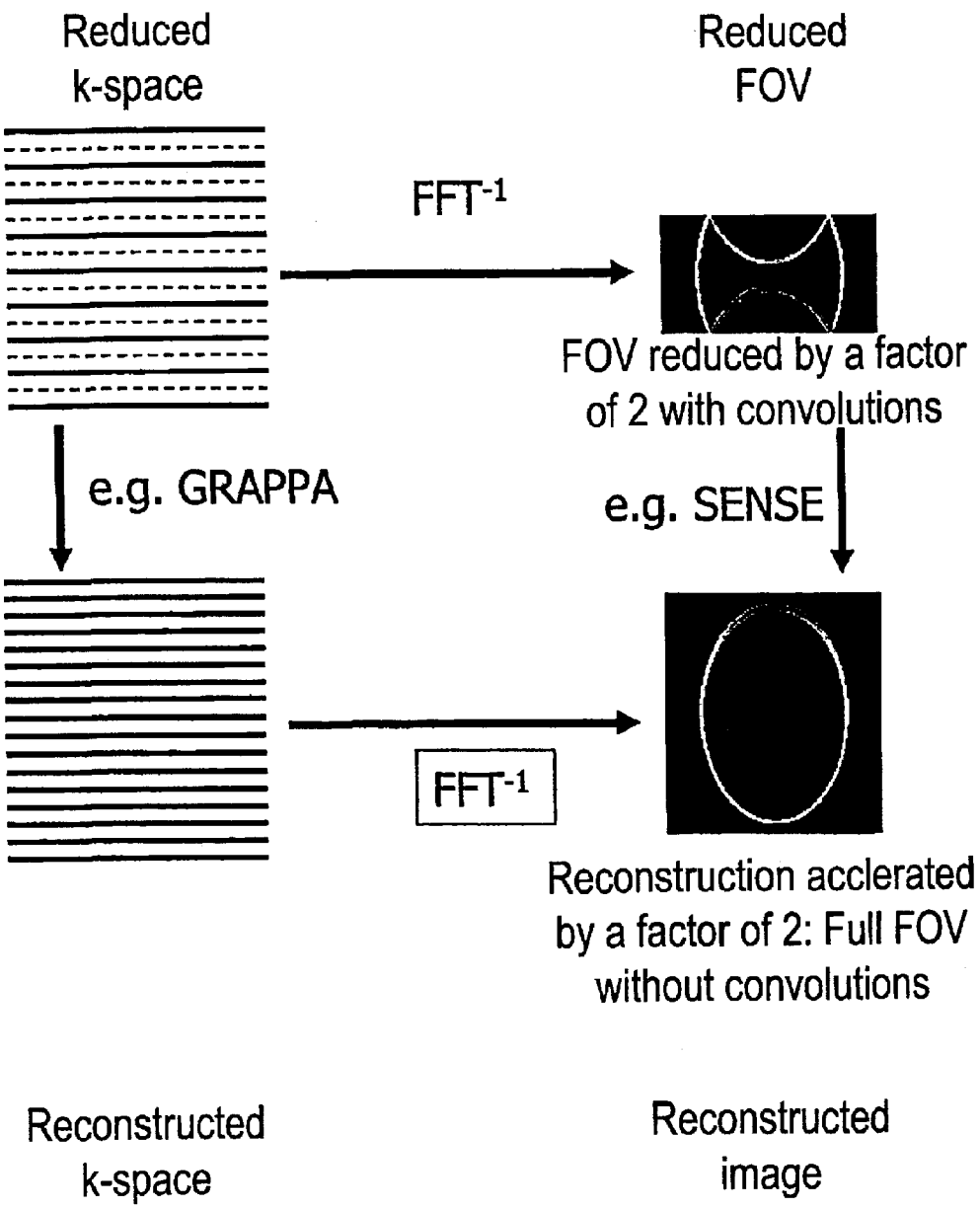
FIG. 1, as noted above, schematically illustrates the basic features of known parallel imaging techniques.
Figure 3:
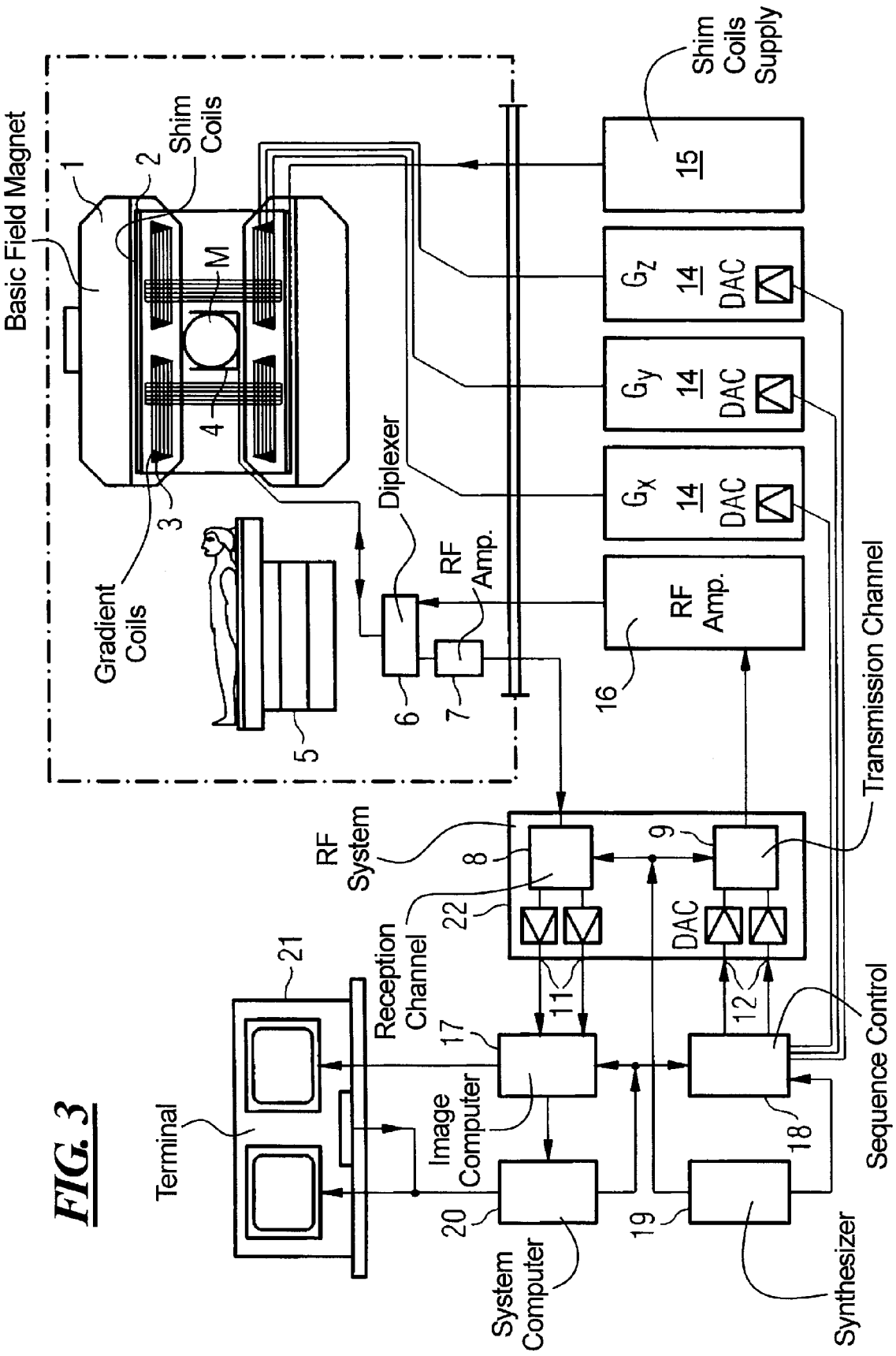
FIG. 3 schematically illustrates the basic components of a magnetic resonance imaging apparatus constructed and operating in accordance with the present invention.

FIG. 3 is a schematic illustration of a magnetic resonance imaging or magnetic resonance tomography apparatus for generating a magnetic resonance image of a subject according to the present invention. The design of the magnetic resonance tomography apparatus thereby corresponds that of a conventional magnetic tomography apparatus, with the differences identified below. A basic field magnet 1 generates a temporally-constant strong magnetic field for polarization or alignment of the nuclear spins in the examination region of a subject such as, for example, of a part of a human body to be examined. The high homogeneity of the basic magnetic field necessary for the magnetic resonance measurement is defined in a spherical measurement volume V in which the parts of the human body to be examined are introduced. To support the homogeneity requirements, and in particular for elimination of temporally invariable influences, shim plates made of ferromagnetic material are mounted at a suitable location. Temporally variable influences are eliminated by shim coils 2 that are activated by a shim power supply 15.

A gradient coil system 3 is composed of a number of windings (sub-windings) is disposed in the basic field magnet 1. Each sub-winding is supplied with current by an amplifier for generation of a linear gradient field in the respective directions of the Cartesian coordinate system. The first sub-coil of the gradient coil system 3 thereby generates a gradient Gx in the x-direction, the second sub-coil generates a gradient Gy in the y-direction and the third sub-coil generates a gradient Gz in the z-direction. Each amplifier includes a digital-analog converter that is activated by a sequence controller 18 for time-accurate generation of gradient pulses.

Located within the gradient coil system 3 is a radio-frequency antenna 4 that converts the radio-frequency pulses emitted by a radio-frequency power amplifier into an alternating magnetic field for excitation of the nuclei and alignment of the nuclear spins of the subject to be examined or of the region of the subject to be examined. The radio-frequency antenna 4 includes one or more RF transmission coils and a number of RF reception coils in the form, for example, of a linear array of component coils in PPA imaging systems. The alternating field originating from the precessing nuclear spins (i.e. normally the nuclear spin echo signals caused by a pulse sequence composed of one or more radio-frequency pulses and one or more gradient pulses) is also converted by the RF reception coils of the radio-frequency antenna 4 into a voltage that is supplied via an amplifier 7 to a radio-frequency reception channel 8 of a radio-frequency system 22. The radio-frequency system 22 furthermore has a transmission channel 9 in which are generated the radio-frequency pulses for excitation of the magnetic resonance. The respective radio-frequency pulses are thereby digitally represented in the sequence controller 18 as a series of complex numbers based on a pulse sequence predetermined by the system computer 20. The real and imaginary parts of this number series are respectively supplied via inputs 12 to a digital-analog converter in the radio-frequency system 22, and from this to a transmission channel 9. In the transmission channel 9, the pulse sequences are modulated with a radio-frequency carrier signal having a base frequency that corresponds to the resonance frequency of the nuclear spins in the measurement volume.

The switch-over from transmission to reception operation ensues via a transmission-reception diplexer 6. The RF transmission coil of the radio-frequency antenna 4 radiates the radio-frequency pulses for excitation of the nuclear spins into the measurement volume V for excitation of the nuclear spins and samples resulting echo signals via the RF reception coils. The correspondingly-acquired magnetic resonance signals are phase-sensitively demodulated in the reception channel 8 of the radio-frequency system 22 and translated into a real part and an imaginary part of the measurement signal via respective analog-digital converters. An image is reconstructed by an image computer 17 from the measurement data acquired in this manner. The administration of the measurement data, the image data and the control programs ensues via the system computer 20. Based on requirements set by control programs, the sequence controller 18 monitors the generation of the respective desired pulse sequences and the corresponding sampling of k-space. The sequence controller 18 in particular controls the time-accurate switching of the gradients, the emission of the radio-frequency pulses with defined phase and amplitude and the reception of the magnetic resonance signals. The time base for the radio-frequency system 22 and the sequence controller 18 is provided by a synthesizer 19. The selection of suitable control programs for generation of a magnetic resonance image as well as the representation of the generated magnetic resonance image ensues through a terminal (console) 21 that has a keyboard as well as one or more display screens.

In order to be able to implement PPA measurements with an MRT apparatus, it is standard (in particular in the phase coding direction) to not use a single coil but rather to use an arrangement composed of a number of coils. The coils or such an arrangement, known as component coils, are connected to form a coil array and are arranged mutually adjacent or overlapping one another, so adjoining, overlapping coil images can likewise be acquired. If the acquisition time should not be lengthened given improvement of the SNR, the coils of a coil array must acquire signals simultaneously. Each coil consequently requires its own receiver channel, which includes a preamplifier, a mixer and an alarm-to-digital converter.

Further details regarding PPA imaging, and GRAPPA data acquisition and image reconstruction in particular, are described in copending U.S. application Ser. No. 11/409,373, the teachings of which are incorporated herein by reference.

Figure 4:
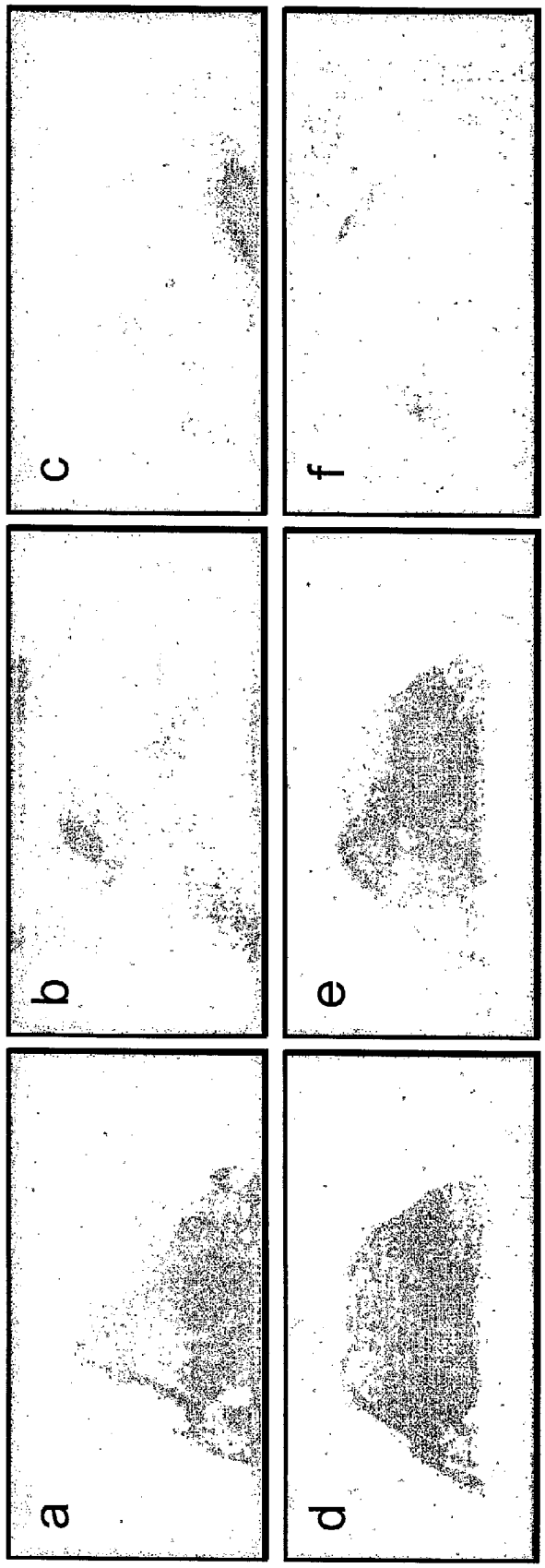
FIG. 4 shows six images from respective phantom studies conducted respectively using prior art techniques individually, and the combined method in accordance with the present invention.

FIG. 4 illustrates images (a), (b), (c), (d), (e) and (f) obtained using a phantom. Image (a) of the phantom was obtained with conventional EPI. Image (b) is an image that was sub-sampled four times, and shows severe convolutions. Image (c) shows an image obtained with GRAPPA EPI reconstruction, accelerated 4-fold, and still contains several remaining artifacts. Image (d) was obtained with zoomed EPI accelerated 4-fold, and convolutions are visible in this image. Image (e) was obtained with a zoomed GRAPPA EPI accelerated 4-fold, in accordance with the present invention, wherein it can be seen that artifacts are significantly reduced. Image (f) is a difference image obtained from image (d) and image (e).

Figure 5:
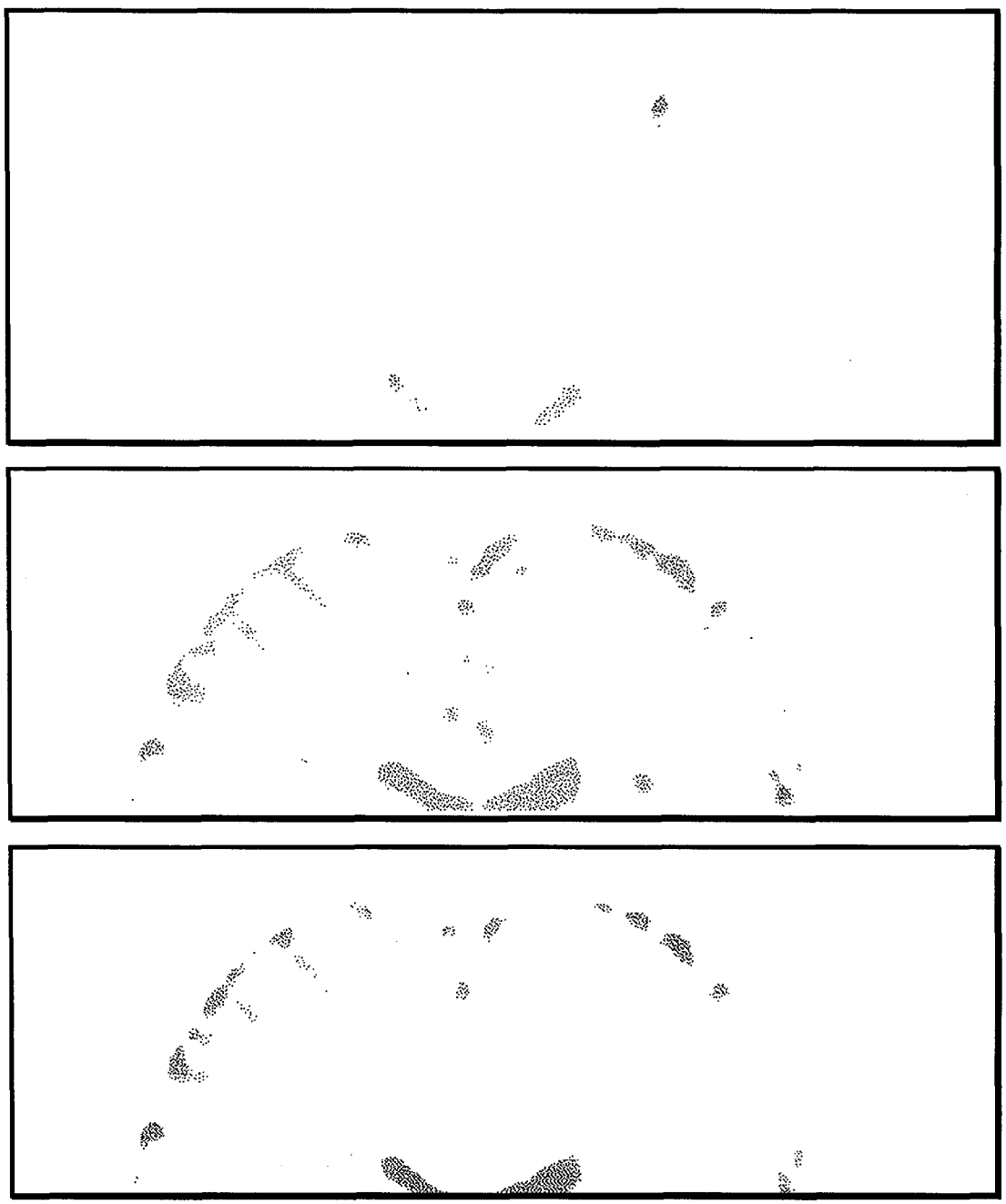
FIG. 5 shows images from in vivo studies conducted using a known parallel imaging method and a known zoomed method, and the combined method in accordance with the present invention.

FIG. 5 shows three images obtained with an in vivo study. The top image was obtained with conventional (EPI), unaccelerated. The middle image was obtained with zoomed EPI, accelerated 4-fold, and the bottom image was obtained in accordance with the invention by zoomed GRAPPA EPI, accelerated 4-fold, wherein again it can be seen that the image artifacts are significantly reduced.

Besides the improvements in image quality achieved by the method and apparatus as described above, it is possible to use the inventive method and apparatus t achieve higher acceleration factors as with zoomed techniques or parallel imaging techniques on their own. With a zoomed approach a reduced FOV, which corresponds to an acceleration facto for $AF_z$ can be obtained. This reduced FOV can be further reduced by employing parallel imaging, which corresponds to an acceleration factor of $AF_p$. In total this acquisition is accelerated by a factor of $AF_z$ times $AF_p$.

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance imaging method comprising the steps of:
    acquiring magnetic resonance data from an examination subject located in a magnetic resonance data acquisition unit, by operating said data acquisition'unit with a zoomed technique; and
    in a computerized processor, reconstructing an image of the examination subject from said magnetic resonance data using a parallel imaging reconstruction technique.

2. A method as claimed in claim 1 comprising operating said data acquisition unit with an OVS method as said zoomed method.

3. A method as claimed in claim 1 comprising employing GRAPPA image reconstruction in said processor as said parallel imaging technique.

4. A method as claimed in claim 1 comprising employing SENSE image reconstruction in said processor as said parallel imaging technique.

5. A method as claimed in claim 1 comprising operating said data acquisition unit with OVS as said zoomed method and employing GRAPPA image reconstruction in said processor as said parallel imaging method.

6. A magnetic resonance imaging apparatus comprising:
    a magnetic resonance data acquisition unit configured to interact with an examination subject to acquire magnetic resonance data from the examination subject;
    a control unit configured to operate said magnetic resonance data acquisition unit to acquire said magnetic resonance data using a zoomed method and to reconstruct an image of the examination subject from the acquired magnetic resonance data using a parallel imaging method; and
    a display connected to said control unit at which said image of the examination subject is displayed.

7. An apparatus as claimed in claim 6 wherein said control unit is configured to operate said magnetic resonance data acquisition unit using an OVS method as said zoomed method.

8. An apparatus as claimed in claim 6 wherein said control unit is configured to operate said magnetic resonance data acquisition unit using GRAPPA as said parallel imaging method.

9. An apparatus as claimed in claim 6 wherein said control unit is configured to operate said magnetic resonance data acquisition unit using SENSE as said parallel imaging method.

10. An apparatus as claimed in claim 6 wherein said control unit is configured to operate said magnetic resonance data acquisition unit using an OVS method as said zoomed method and using GRAPPA as said parallel imaging method.

* * * * *